United States Patent
Hoshi et al.

(10) Patent No.: US 8,958,213 B2
(45) Date of Patent: Feb. 17, 2015

(54) MOUNTING STRUCTURE OF CHIP COMPONENT

(71) Applicant: Taiyo Yuden Co., Ltd., Tokyo (JP)

(72) Inventors: Yuji Hoshi, Gunma (JP); Masataka Watabe, Gunma (JP); Motoki Kobayashi, Gunma (JP); Shota Yajima, Gunma (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 119 days.

(21) Appl. No.: 13/922,409

(22) Filed: Jun. 20, 2013

(65) Prior Publication Data

US 2014/0003014 A1    Jan. 2, 2014

(30) Foreign Application Priority Data

Jun. 28, 2012   (JP) .................................. 2012-144859

(51) Int. Cl.
*H05K 7/10* (2006.01)
*H05K 1/18* (2006.01)
*H05K 3/34* (2006.01)

(52) U.S. Cl.
CPC .............. *H05K 1/181* (2013.01); *H05K 3/3442* (2013.01); *H05K 2201/09381* (2013.01); *H05K 2201/10636* (2013.01)
USPC ........................................................ 361/767

(58) Field of Classification Search
None
See application file for complete search history.

(56) References Cited

U.S. PATENT DOCUMENTS

2005/0178002 A1 * 8/2005 Maeno ............................ 29/840
2006/0007640 A1 * 1/2006 Ishifune et al. ............... 361/523

FOREIGN PATENT DOCUMENTS

| JP | H9-139324 | A |   | 5/1997 |          |
|----|-----------|---|---|--------|----------|
| JP | 11017308  | A | * | 1/1999 | H05K 1/18 |
| JP | 2005-276888 | A |   | 10/2005 |        |
| JP | 2010-212318 | A |   | 9/2010 |         |

* cited by examiner

*Primary Examiner* — Timothy Thompson
*Assistant Examiner* — Guillermo Egoavil
(74) *Attorney, Agent, or Firm* — Chen Yoshimura LLP

(57) ABSTRACT

A mounting structure of a chip component includes a chip component that is bonded by having a pair of external terminal electrodes provided on both ends of an element body of the thin chip component bonded to a pair of lands respectively through solder, the pair of lands being provided on an attaching substrate in a lateral direction with respect to each other. Where plan view distances from ends of the external terminal electrodes at the ridge lines formed between the surfaces and side faces of the element body of the chip component to the edges of the lands connected to the external terminal electrodes are designated as "d," and the vertical distances from the bottom surfaces of the external terminal electrodes and the lands are designated as "t," then d>t/tan 35° and preferably d>t/tan 25° is fulfilled.

9 Claims, 16 Drawing Sheets

MOUNTING STRUCTURE OF CHIP COMPONENT

This application claims the benefit of Japanese Application No. 2012-144859 filed in Japan on Jun. 28, 2012, which is hereby incorporated by reference in its entirety.

BACKGROUND OF THE INVENTION

1. Field of the Invention

The present invention relates to a mounting structure of a chip component, and in particular, relates to a mounting structure of a chip component in which it is possible to mitigate a decrease in bonding strength of a thin chip component.

2. Description of Related Art

In recent years, demand has increased for miniaturization and an increase in density for chip components, and various problems have become apparent as chip components have become miniaturized and as the density thereof has increased. Refer to Patent Document 1, for example. In Patent Document 1, the gap between terminals is set to be narrower than the gap between lands in order to make the chip component connected to lands provided on a printed circuit board not susceptible to being separated from the printed circuit board after being mounted, thus improving connective reliability. As a result, solder portions are connected to the terminals of the chip component while being inclined at acute angles in relation to a plane extending from one land to the opposite land, and thus, the chip component has a greater resistance to being separated from the printed circuit board.

However, problems that need to be addressed as chip components are miniaturized and the density thereof is increased are not limited to the above-mentioned problem. For example, increased density results in various problems such as bridging, component misalignment, open solder defect, missing parts, solder balling, tombstoning, and IC damage, due to the particle size of the solder paste becoming smaller or the space between components becoming narrower.

Refer to Patent Document 2, for example. In Patent Document 2, in order to ensure sufficient strength in a solder bonding portion and prevent solder melting defects, a solder resist in the bonding surface vicinity portion for lands to be soldered is given a pattern in which an opening narrower than the short side of a chip component is provided in the shorter side direction of the chip component between the left and right lands on the substrate to which the chip component is to be connected, and the pattern having this opening between the lands is formed such that the width of the opening becomes wider in directions opposite to the center between the left and right lands.

Refer to Patent Document 3. In Patent Document 3, in order to mitigate the occurrence of solder balling and to prevent misalignment and tombstoning of the chip component, each of the pair of lands on the printed circuit board is constituted of an electrode mounting portion, an outer overhang portion, and an inner overhang portion, and the amount of overhang for the outer overhang portion is set to ¼ the width of the electrode mounting portion, while the amount of overhang for the inner overhang portion is set to ⅕ the width of the electrode mounting portion.

RELATED ART DOCUMENTS

Patent Documents

Patent Document 1: Japanese Patent Application Laid-Open Publication No. H9-139324

Patent Document 2: Japanese Patent Application Laid-Open Publication No. 2010-212318

Patent Document 3: Japanese Patent Application Laid-Open Publication No. 2005-276888

SUMMARY OF THE INVENTION

As described above, various measures have been taken to solve the problems resulting from miniaturization and increased density of the chip components, but in many cases, these measures are inadequate to solve the problems occurring after mounting as the chip component is further miniaturized.

The inventors of the present invention have conducted a comprehensive study in order to find a way to optimize the mounting structure of a chip component based on all dimensions including length, width, and thickness of the chip component. FIG. 13 shows one example of a mounting structure of a chip component. In this mounting structure, a chip component 10' is bonded by solder to a pair of lands $L_1$ and $L_2$ positioned laterally with respect to each other on an attaching substrate through a pair of external terminal electrodes $E_1$ and $E_2$ provided on both ends of an element body 1a of the chip component 10'. In such a mounting structure, upon studying post-mounting defects such as cracking, it was found in particular that chip components that are thin have a low flexural strength (particularly the ends of the external terminal electrodes), which leads to breakage if stress thereon is concentrated. It was found that the breakage occurs at the boundaries between the external terminal electrodes and the element body of the chip component.

FIGS. 14A to 14C show a mounting structure of one of the lands $L_1$. In this case, the boundary between the external terminal electrode $E_1$ and the element body 1a of the chip component 10' has a curved shape that protrudes from the land $L_1$. In FIG. 14A, both a case in which the boundary between the external terminal electrode $E_1$ and the element body 1a of the chip component 10' is within the land $L_1$, and a case in which the boundary is outside of the land $L_1$ are shown together. FIG. 14B shows a case in which the boundary is outside of the land $L_1$ and FIG. 14C shows a case in which the boundary is within the land $L_1$. Here, of the boundary between the external terminal electrode $E_1$ and the element body 1a of the chip component 10', stress is concentrated at the intersection point between the ridge line of the element body 1a of the chip component 10' and the external terminal electrode $E_1$, and thus, this intersection point is a crack starting point α. An intersection point between the vertical line extending towards the attaching substrate from the crack starting point α and the attaching substrate is defined as a starting point P, and the distance from the starting point P to the land edge Le (distance in a plan view) is defined as X. On the other hand, FIGS. 15A to 15C show an example in which the boundary between the external terminal electrode $E_1$ and the element body 1a of the chip component 10' is a curve that protrudes in the opposite direction to that of FIG. 14A, towards the land $L_1$. FIG. 15B shows a case in which the boundary is outside of the land $L_1$ and FIG. 15C shows a case in which the boundary is within the land $L_1$. As a result of studying the configurations of FIGS. 14A to 14C and FIGS. 15A to 15C, it was found that the strength is decreased for configurations in which the distance X from the land edge Le to the starting point P is shorter.

Based on what is stated above, it is apparent that from the perspective of the strength to resist cracking from outside stress, the dimensional relationship of the external terminal electrodes $E_1$ and $E_2$ and the land edges Le is relevant. In other words, (1) it is disadvantageous for the respective distances between the external terminal electrodes and the land edges to be small, and (2) it is advantageous for the respective distances between the external terminal electrodes and the land edges to be large (this does not depend on whether or not the external terminal electrodes protrude from the lands). This is due to the fact that cracking occurs at the boundaries between the element body of the chip component 10' and the external terminal electrodes $E_1$ and $E_2$. The present invention takes into consideration the findings above, and according to one aspect, by setting the bonding position relationship between the external terminal electrodes and the lands of the substrate wiring lines when miniaturizing and increasing the density of chip components, the problem of cracking and the like in a thin chip component at the time of mounting is solved, and a mounting structure of a chip component in which the connective reliability is improved is provided.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in order to solve such problems, one aspect of the present invention is a mounting structure of a chip component having an element body and a pair of external terminal electrodes provided on both ends of the element body, the external terminal electrodes being bonded respectively to a pair of lands through solder, the pair of lands being disposed on an attaching substrate in a lateral direction with respect to each other, wherein the chip component has a smaller thickness compared to a length and a width of the element body of the chip component, and wherein, where a plan view distance from an end of each of the external terminal electrodes at a ridge line formed by a front surface and a side face of the element body of the chip component to an edge of a corresponding land connected to each of the external terminal electrodes is "d," and where a vertical distance between a bottom surface of each of the external terminal electrodes and each of the lands is "t," d>t/tan 35°, and preferably d>t/tan 25° is satisfied.

In order to solve such problems, another aspect of the present invention includes a chip component having an element body and a pair of external terminal electrodes provided on both ends of the element body, the external terminal electrodes being bonded respectively to a pair of lands through solder, the pair of lands being disposed on an attaching substrate in a lateral direction with respect to each other, wherein the chip component has a smaller thickness compared to a length and a width of the element body of the chip component, and wherein, where an intersection point between a vertical line from an edge of each of the external terminal electrodes at a ridge line formed between a front surface and a side face of the element body of the chip component, and a land surface or an imaginary land surface is a starting point, where an intersection point between a perpendicular line extending from the starting point to the edge of a corresponding land and the edge of the land is an ending point, where a distance from the starting point to the ending point is "d," and where a vertical distance from the edge of each of the external terminal electrodes at a bottom surface thereof to the starting point is "t," d>t/tan 35°, and preferably d>t/tan 25° is satisfied.

The land surfaces are defined as surfaces of the land in cases in which a land is present at a position corresponding to the vertical line from the edge of the external terminal electrode. The imaginary land surface is defined as an imaginary plane that is raised up from the surface of the attaching substrate by a thickness of the lands, in a case in which no land is present in a position corresponding to the vertical line from the edge of the external terminal electrode.

Here, the edges of the external terminal electrodes may be positioned further within the lands than the land edges on the attaching substrate.

The edges of the external terminal electrodes may be positioned further outside of the lands than the land edges on the attaching substrate.

The edges of the external terminal electrodes may form straight lines.

The edges of the external terminal electrodes may have curved shapes with middle portions thereof that respectively protrude towards the pair of land edges facing each other on the attaching substrate.

The edges of the external terminal electrodes may have curved shapes with middle portions thereof that are respectively recessed from the land edges on the attaching substrate.

According to the present invention, by setting the connective position relationship between the external terminal electrodes and the lands of the substrate wiring lines, it is possible to solve the problem of cracking and the like in the thin chip component at the time of mounting, and to provide a mounting structure of a chip component in which the connective reliability is improved.

DETAILED DESCRIPTION OF THE PREFERRED EMBODIMENTS

A mounting structure of a chip component according to the present invention will be described below with embodiments and based on appended drawings.

Figure 1:
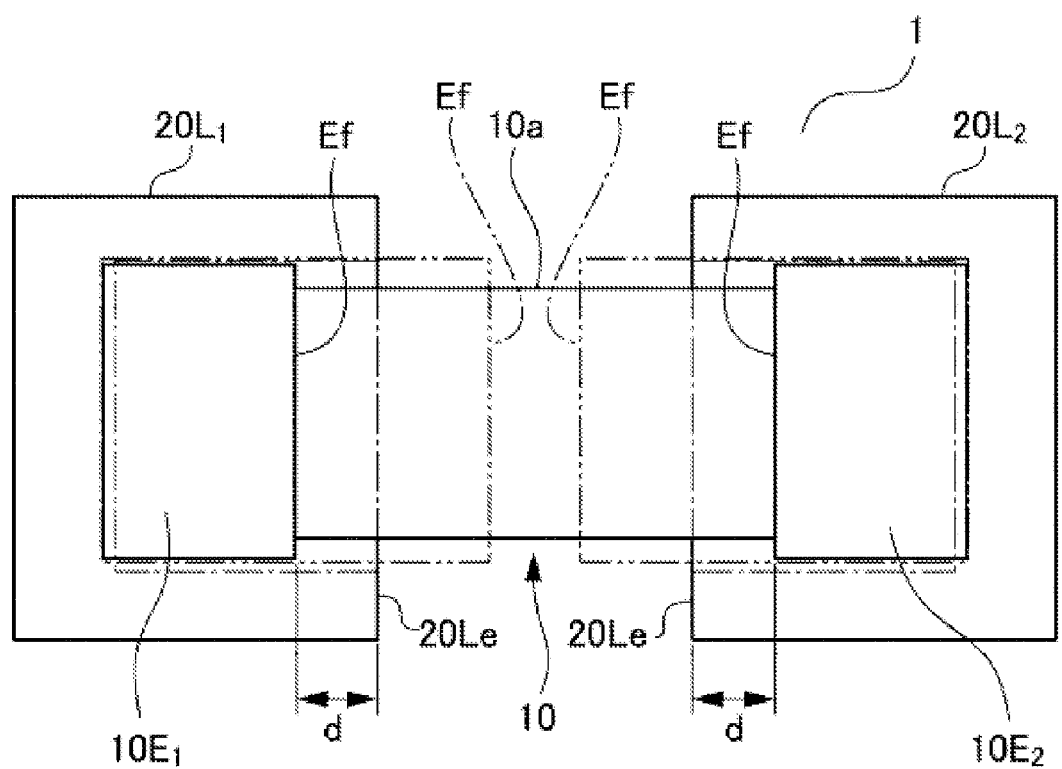
FIG. 1 is a schematic plan view of an embodiment of a mounting structure of a chip component of the present invention.

FIG. 1 is a schematic view for describing a mounting structure of a chip component according to an embodiment. Here, a chip component 10, for example, has a 1005 size (L=1.00±0.05, W=0.50±0.05, t=0.35±0.05) in which the thickness is less than the length and width of the element body of the chip component. In other words, the chip component 10 has a configuration in which external terminal electrodes $10E_1$ and $10E_2$ are provided on both ends of an element body 10 $a$ of the above dimensions and having a rectangular shape in a cross-sectional view.

Figure 2:
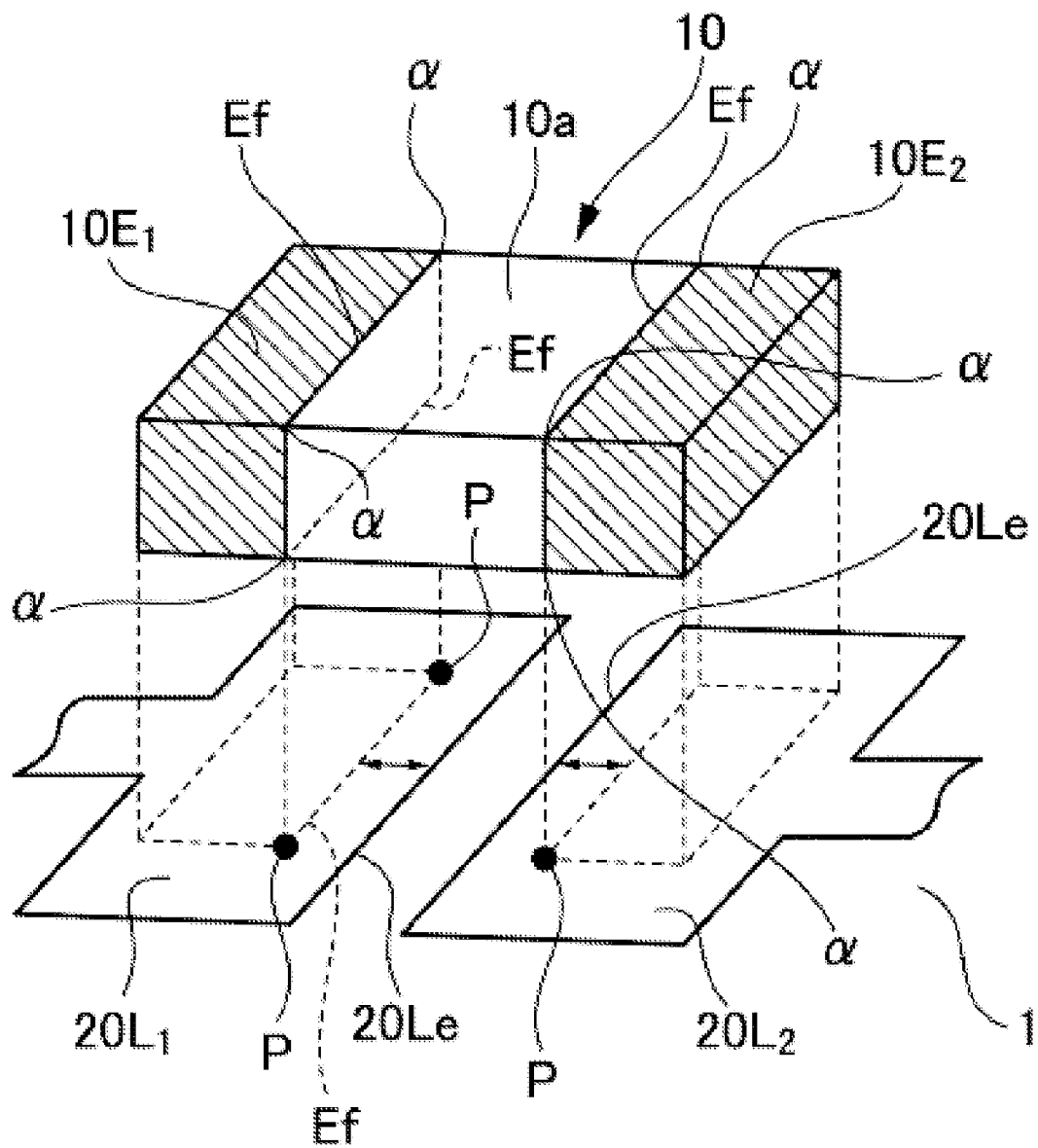
FIG. 2 is a schematic exploded perspective view showing the mounting structure of FIG. 1.

As shown in FIG. 2, such a chip component 10 is bonded by solder to a pair of lands $20L_1$ and $20L_2$ positioned laterally with respect to each other and formed on a surface of an attaching substrate 1 through the external terminal electrodes $10E_1$ and $10E_2$ on both ends of the element body 10$a$.

In such a structure, intersection points between the ridge lines of the element body 10$a$ and the external terminal electrodes $10E_1$ and $10E_2$ at the boundary between the external terminal electrodes $10E_1$ and $10E_2$ and the element body 10$a$ of the chip component 10 can be indicated as crack starting points α, which are points upon which stress is applied.

Figure 16A:
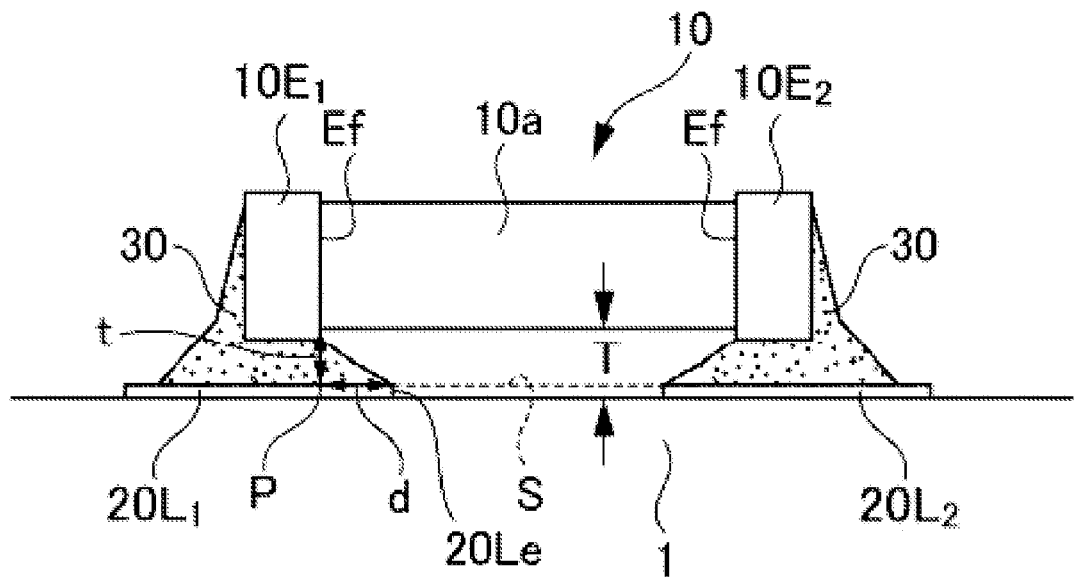
FIG. 16A is a view from a side face of a mounting structure of a chip component 10.
Figure 16B:
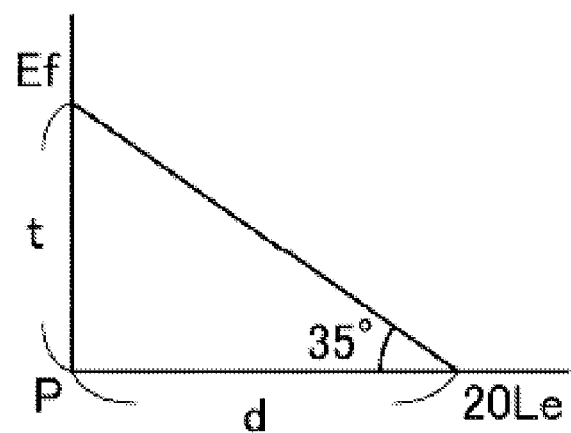
FIG. 16B is a magnified view of the relation between Ef, t, P, d, and 20Le of FIG. 16A.

FIG. 16A is a view from a side face of a mounting structure of the above-mentioned chip component 10. As apparent in FIG. 16A, the external terminal electrodes $10E_1$ and $10E_2$ of the chip component 10 are respectively attached to the lands $20L_1$ and $20L_2$ formed on the surface of the attaching substrate 1 through solder 30. The chip component 10 is disposed with a gap T between the chip component 10 and the attaching substrate 1 as a result of the solder 30. FIG. 16B is a magnified view of the relation between Ef, t, P, d, and 20Le of FIG. 16A.

Figure 3:
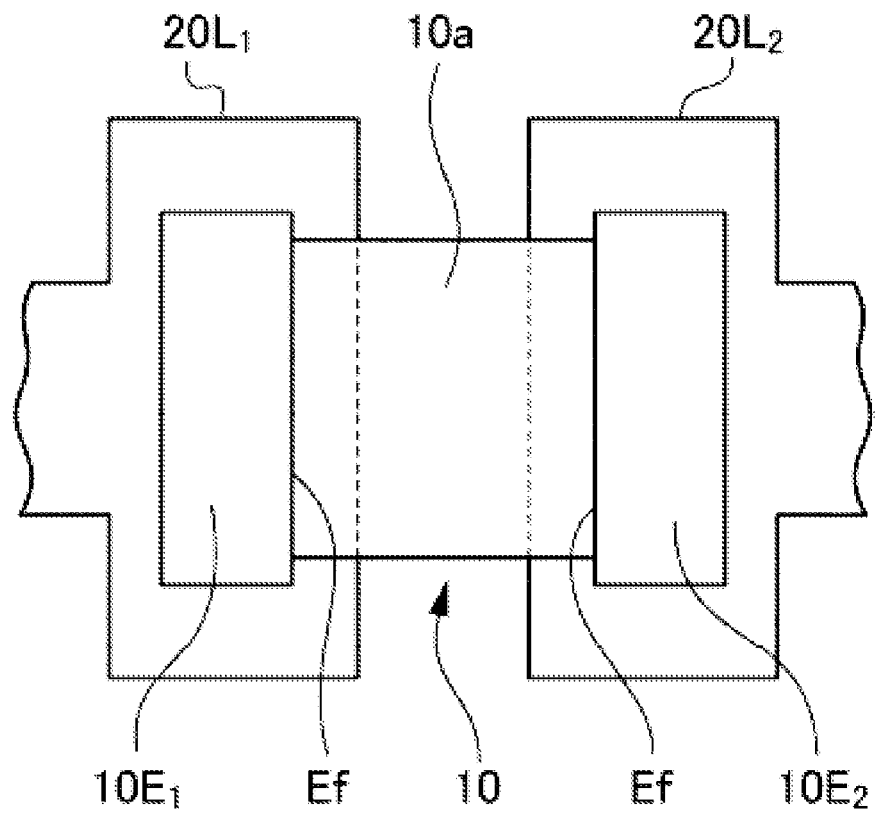
FIG. 3 is a schematic plan view showing one example in which edges of external terminal electrodes are within the lands of substrate wiring lines in the mounting structure shown in FIG. 1.
Figure 4:
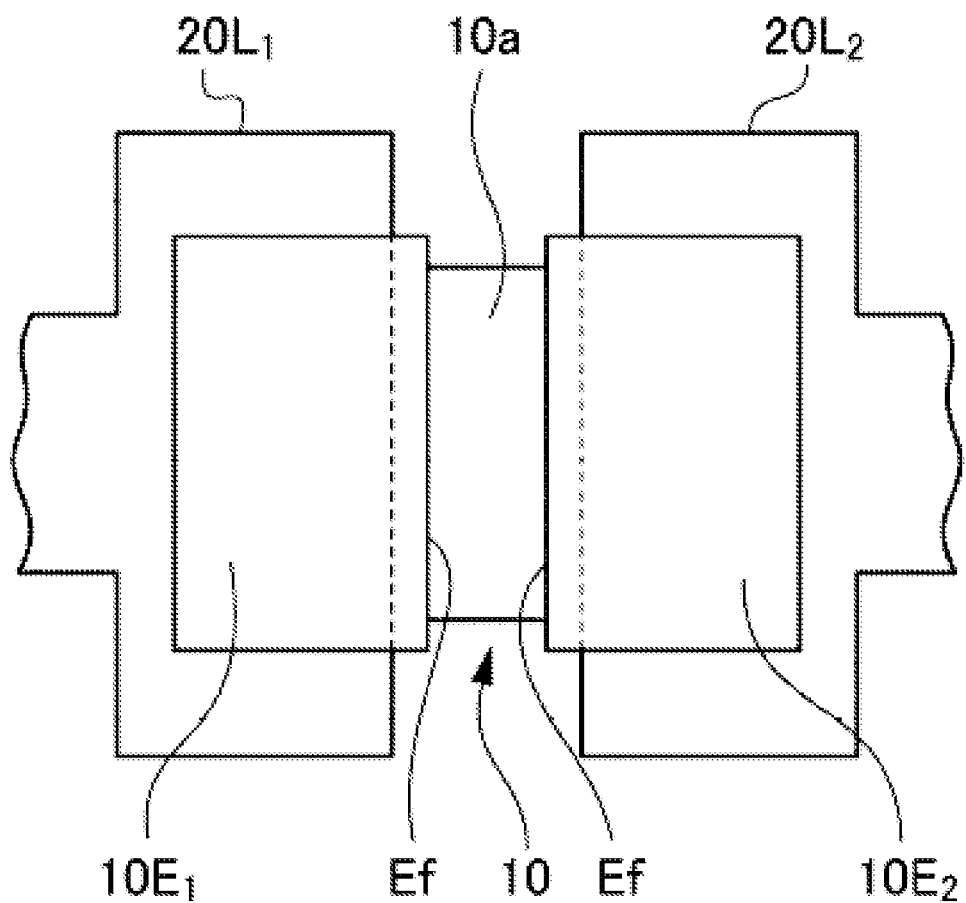
FIG. 4 is a schematic plan view showing one example in which edges of the external terminal electrodes protrude from the lands of substrate wiring lines in the mounting structure shown in FIG. 1.

In the mounting structure shown in FIG. 1, the external terminal electrodes $10E_1$ and $10E_2$ can have dimensions in the lengthwise axis direction of the element body 10$a$ appropriately set as stated below. In other words, the dimensions are set such that edges Ef and Ef, which are boundaries between the element body 10$a$ of the chip component 10 and the external terminal electrodes $10E_1$ and $10E_2$, fall within the pair of lands $20L_1$ and $20L_2$ as shown in the solid lines in the drawing, and as shown in FIG. 3. Also, the dimensions can be set such that in the external terminal electrodes $10E_1$ and $10E_2$, the edges Ef and Ef thereof overlap the land edges 20Le, which face each other, of the lands $20L_1$ and $20L_2$ as shown in the one dot chain lines in the drawing. Additionally, the dimensions can be set such that in the external terminal electrodes $10E_1$ and $10E_2$, the edges Ef and Ef thereof protrude inward from the land edges 20Le, which face each other, of the lands $20L_1$ and $20L_2$ as shown in the two dot chain lines in the drawing and as shown in FIG. 4. Examples are shown in which the edges Ef and Ef of the external terminal electrodes $10E_1$ and $10E_2$ shown above are formed in straight lines.

Next, in order for the present invention to exhibit resistance to cracking resulting from stress from outside after mounting, based on the aforementioned perspective, or in other words, the fact that (1) it is disadvantageous for the respective distances between the external terminal electrodes and the land edges to be small, and (2) it is advantageous for the respective distances between the external terminal electrodes and the land edges to be large (this does not depend on whether or not the external terminal electrodes protrude from the lands), the dimensional relationship between the external terminal electrodes E and the land edges Le will be described.

In FIGS. 1 and 2, where the intersection points between the vertical lines starting at the edges Ef and Ef of the external terminal electrodes $10E_1$ and $10E_2$ at the ridge lines between the horizontal surfaces and the side faces of the element body 10$a$ of the chip component 10, or in other words, the crack starting points α towards the attaching substrate 1 and the surfaces of the lands $20L_1$ and $20L_2$ are starting points P; where the intersection points between the perpendicular lines extending towards the land edges 20Le facing each other in the respective lands $20L_1$ and $20L_2$, and the land edges 20Le are the ending points; where the dimensions from the starting points P to the respective ending points are "d;" and where the distances between the edges Ef and Ef on the bottom of the external terminal electrodes $10E_1$ and $10E_2$ and the starting points P are "t," (refer to FIGS. 16A and 16B), d>t/tan 35° is satisfied.

Here, "t" represents the distance between the external terminal electrodes $10E_1$ and $10E_2$ of the chip component 10 to the lands $20L_1$ and $20L_2$ with the solder 30 therebetween, and is generally from 25 μm (0.025 mm) to 35 μm to (0.035 mm). When increasing the distance between the external terminal electrodes $10E_1$ and $10E_2$ and the land edges Le, crack resistance is ensured by increasing the distance between the external terminal electrodes $10E_1$ and $10E_2$ and the land edges Le if the value of "t" is also taken into consideration, or in other words, if "t" is also increased.

Here, in some cases, it may be preferable that |d| be greater than or equal to 0.10mm, and it may be even more preferable that |d| be greater than or equal to 0.15 mm. These conditions are the basis of a 1005 size (L=1.00 ±0.05, W=0.50 ±0.05, t=0.35 ±0.05) chip component as the chip component 10. In other words, of the dimensions of the 1005 size, "d" is smaller than the thickness (t=0.35 ±0.05 ).

Figure 5:
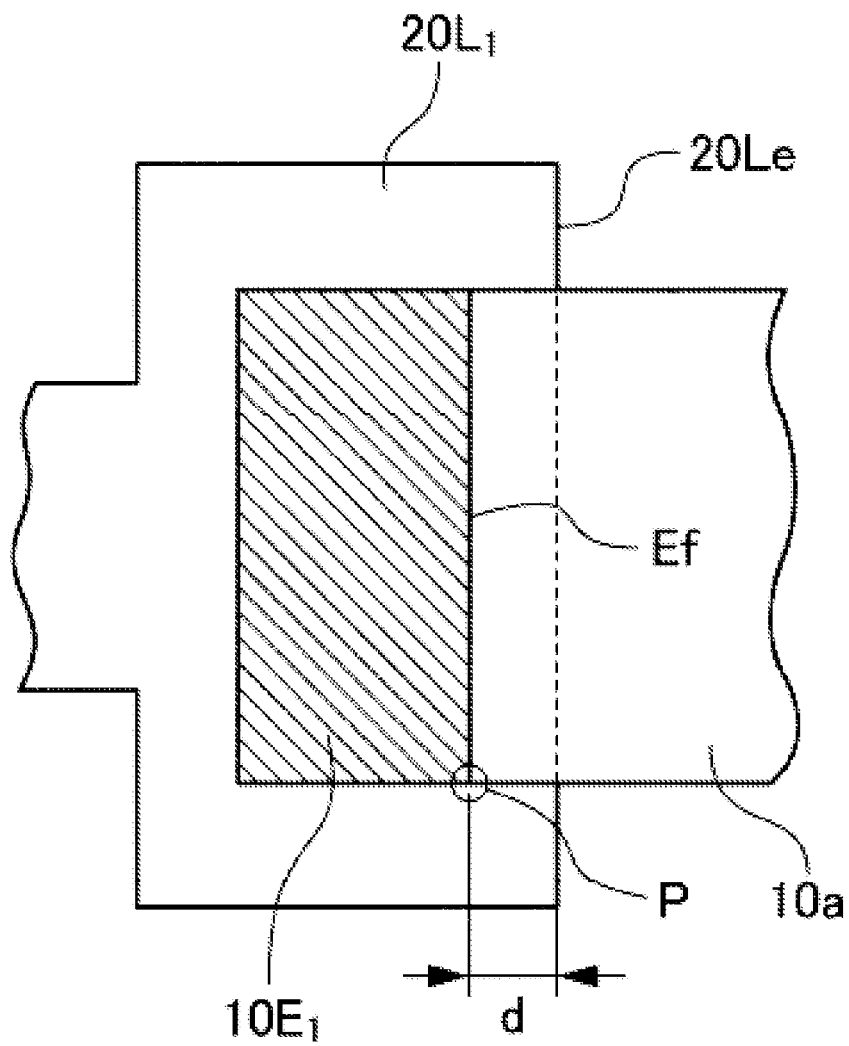
FIG. 5 is a partial schematic view for describing dimensions of the mounting structure shown in FIG. 3 in which the edges of the external terminal electrodes are within the lands of the substrate wiring lines.

By setting |d| to greater than or equal to 0.10 mm, regardless of whether the edges Ef and Ef of the external terminal electrodes $10E_1$ and $10E_2$ are within the lands $20L_1$ and $20L_2$ (refer to FIG. 5), or whether the edges Ef and Ef protrude outside of the lands $20L_1$ and $20L_2$ (refer to FIG. 6), it is possible to fulfill the conditions for the chip component to exhibit resistance to cracking resulting from stress applied from outside after mounting.

Figure 6:
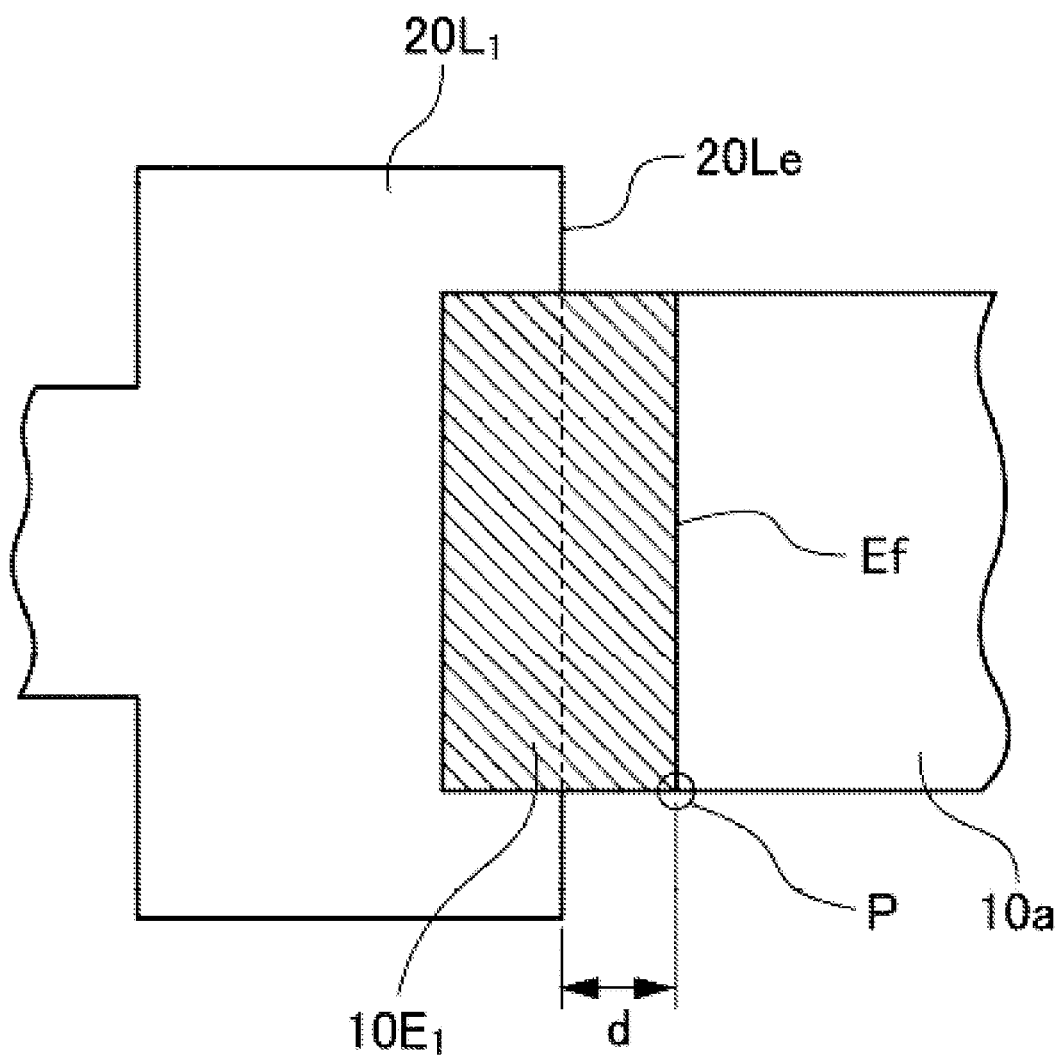
FIG. 6 is a partial schematic view for describing dimensions of the mounting structure shown in FIG. 4 in which the edges of the external terminal electrodes are outside of the lands of the substrate wiring lines.

In the case of FIG. 6, the starting points P are assumed to be on a horizontal plane over the surface of the attaching substrate 1 where the lands $20L_1$ and $20L_2$ are not formed, the horizontal plane being at a height from the surface of the attaching substrate 1 equal to the thickness of the lands $20L_1$ and $20L_2$ (this is defined in the specification as the imaginary land surface, and is indicated with the reference character S in FIG. 16A), and the above inequality d>t/tan 35° is applied.

In this manner, in the present embodiment, where the intersection points between the vertical lines drawn from the edges Ef and Ef of the external terminal electrodes $10E_1$ and $10E_2$ at the ridge lines between the horizontal surfaces and the side faces of the chip component, and the land surfaces if the lands $20L_1$ and $20L_2$ are formed or the imaginary land surface if the lands $20L_1$ and $20L_2$ are not formed are designated as the starting points P; where the intersection points between the perpendicular lines from the starting points P towards the land edges 20Le on the side opposite to the drawing side of the conductor wiring lines, and the land edges 20Le are the ending points; where the respective distances from the starting points P to the ending points are "d;" and where the distances between the edges Ef and Ef on the bottom of the external terminal electrodes $10E_1$ and $10E_2$ and the starting points P are "t," d>t/tan 35° . Thus, it is possible for the chip component to exhibit resistance to cracking resulting from stress from outside after mounting, and a desired post-mounting strength can be attained.

Figure 7:
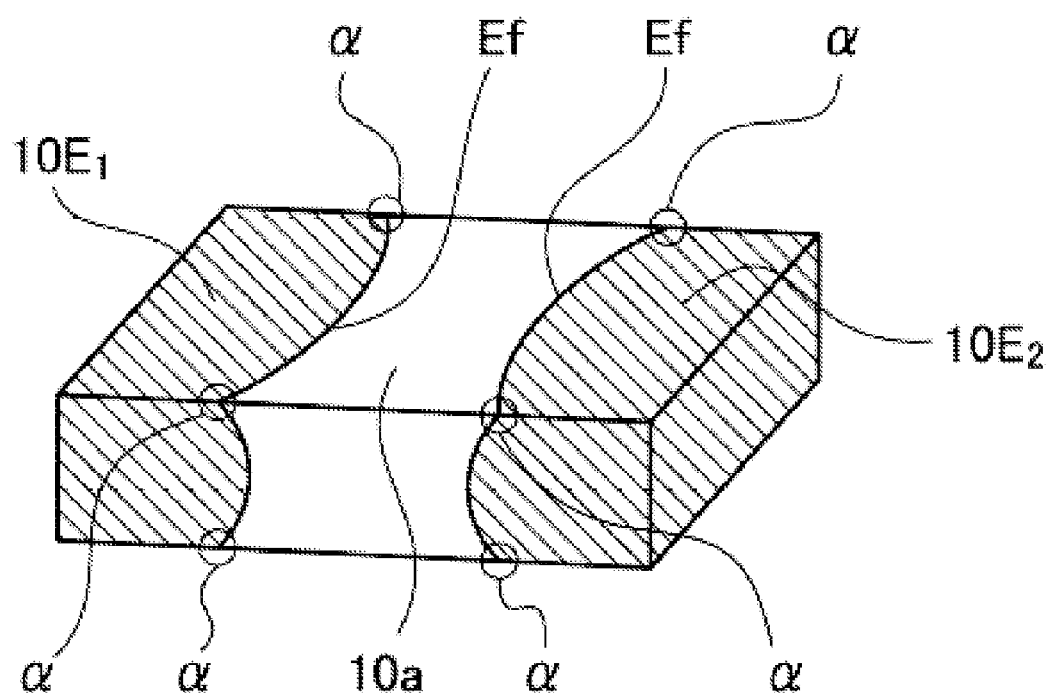
FIG. 7 is schematic perspective view of a chip component showing another embodiment of a mounting structure of a chip component of the present invention.
Figure 8:
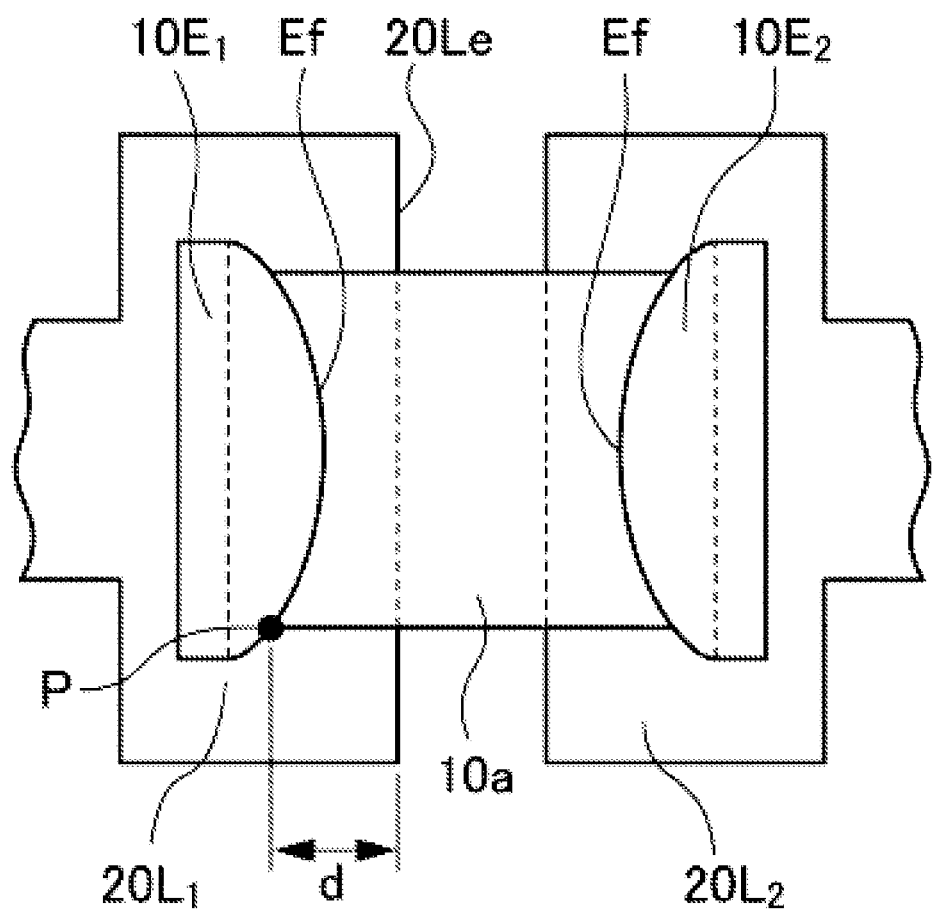
FIG. 8 is a schematic plan view showing one example in which edges of external terminal electrodes are within the lands of substrate wiring lines in the mounting structure shown in FIG. 7.
Figure 9:
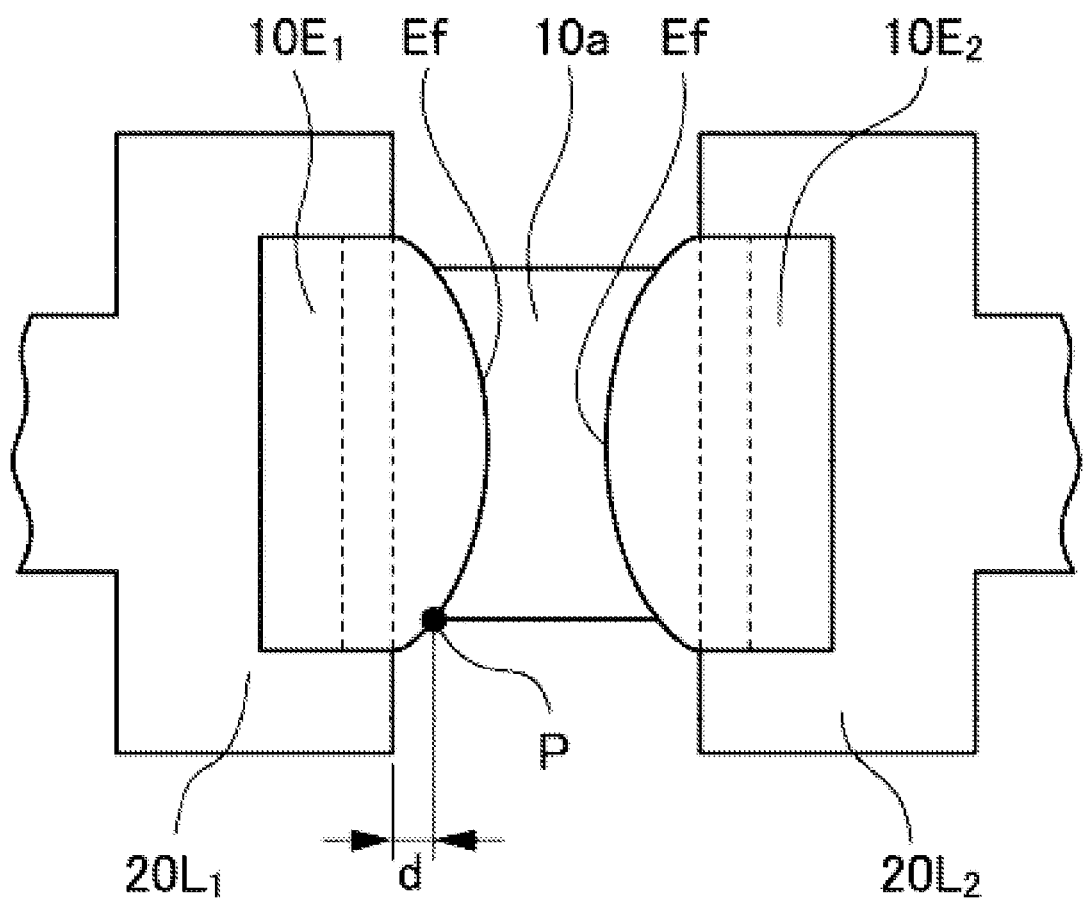
FIG. 9 is a schematic plan view showing one example in which edges of external terminal electrodes are outside of the lands of substrate wiring lines in the mounting structure shown in FIG. 7.

With respect to the mounting structure of a chip component according to the present invention, an example was described above in which the edges Ef and Ef of the external terminal electrodes $10E_1$ and $10E_2$ towards the element body 10a of the chip component 10 were straight lines. However, it is apparent that the edges Ef and Ef are not limited to being straight lines. Refer to FIG. 7, for example. In this case, the edges Ef and Ef have curved shapes in which the middle portions thereof protrude towards the pair of land edges 20Le, which face each other, on the attaching substrate 1. In this case, the crack starting points α are the intersection points between the ridge lines of the element body 10a of the chip component 10 and the edges Ef and Ef. This is because stress is concentrated at these intersection points, and there is a possibility that cracks would start there. In other words, whether the external terminal electrodes $10E_1$ and $10E_2$ are within the lands $20L_1$ and $20L_2$ (refer to FIG. 8), or whether the external terminal electrodes $10E_1$ and $10E_2$ protrude outside of the lands $20L_1$ and $20L_2$ (refer to FIG. 9), the starting points α of the cracks are at the intersection points between the ridge lines of the element body 10a of the chip component 10 and the edges Ef and Ef. Where the intersection points between the vertical lines from the crack starting points α towards the attaching substrate 1 and the attaching substrate 1 are starting points P, the respective distances of the perpendicular lines from the respective starting points P and towards the land edges 20Le are "d."

Figure 10:
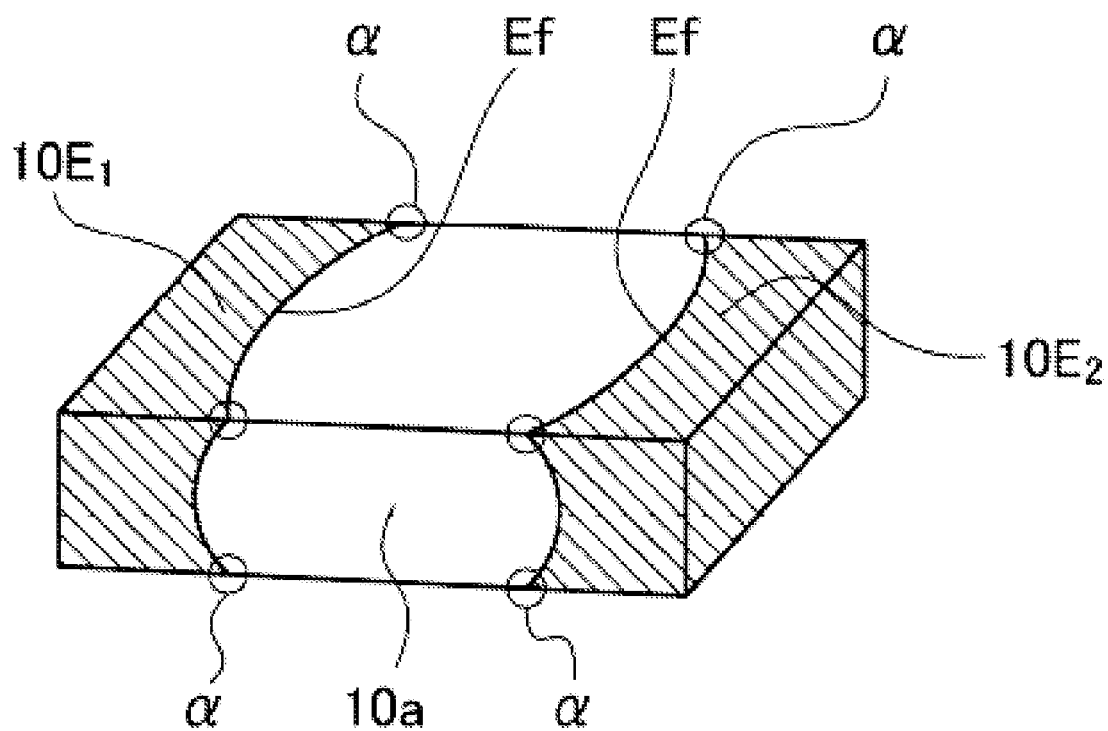
FIG. 10 is schematic perspective view of a chip component showing yet another embodiment of a mounting structure of a chip component of the present invention.
Figure 11:
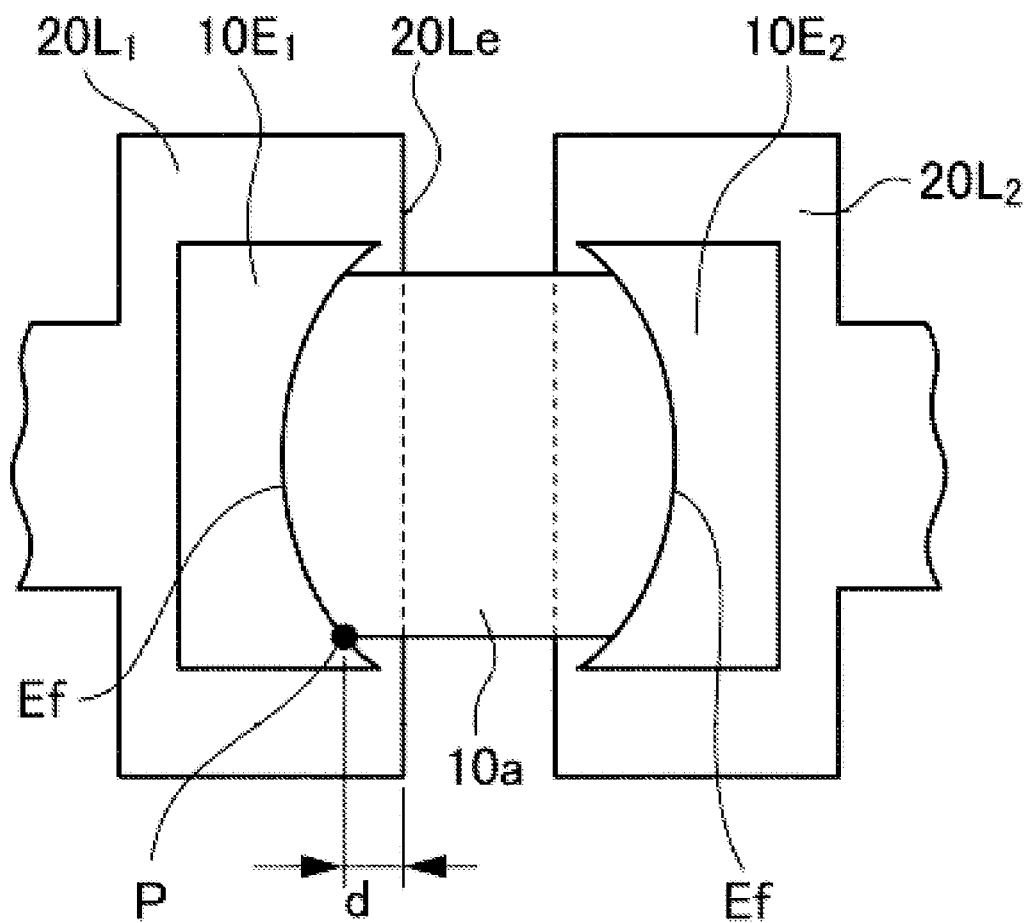
FIG. 11 is a schematic plan view showing one example in which edges of external terminal electrodes are within the lands of substrate wiring lines in the mounting structure shown in FIG. 10.
Figure 12:
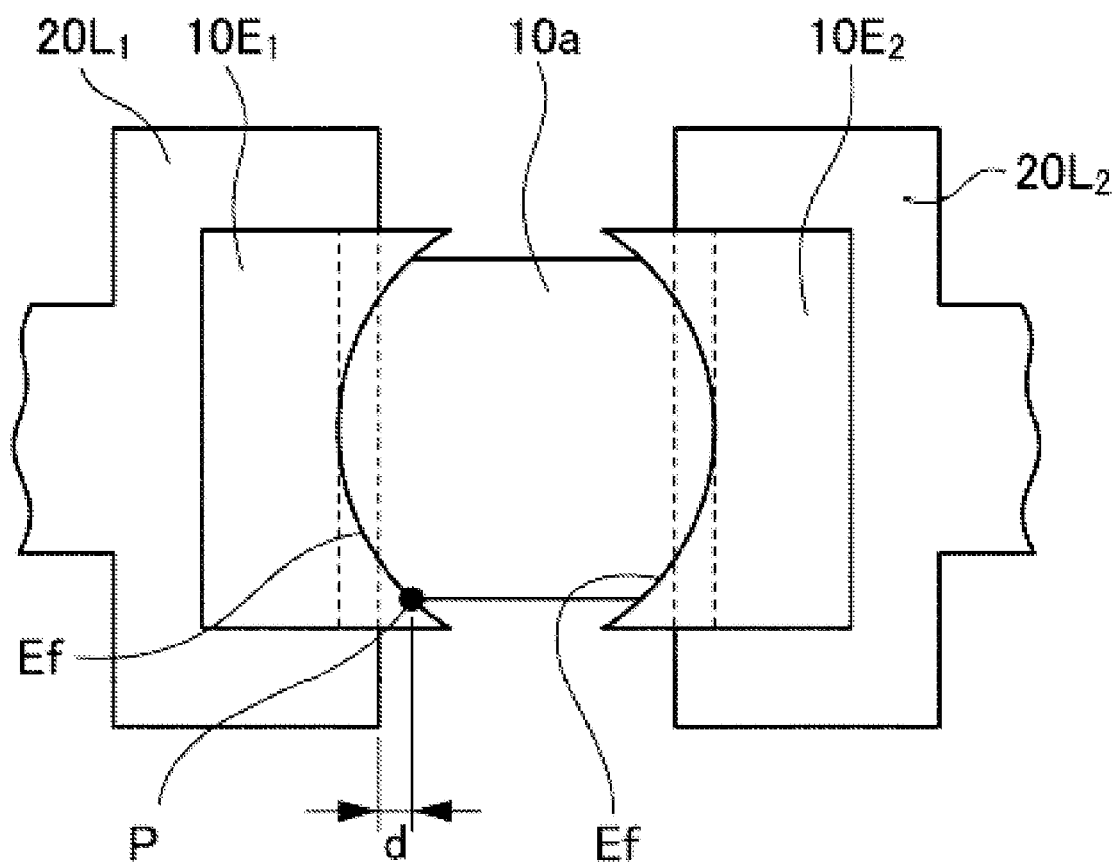
FIG. 12 is a schematic plan view showing one example in which edges of external terminal electrodes are outside of the lands of substrate wiring lines in the mounting structure shown in FIG. 10.
Figure 13:
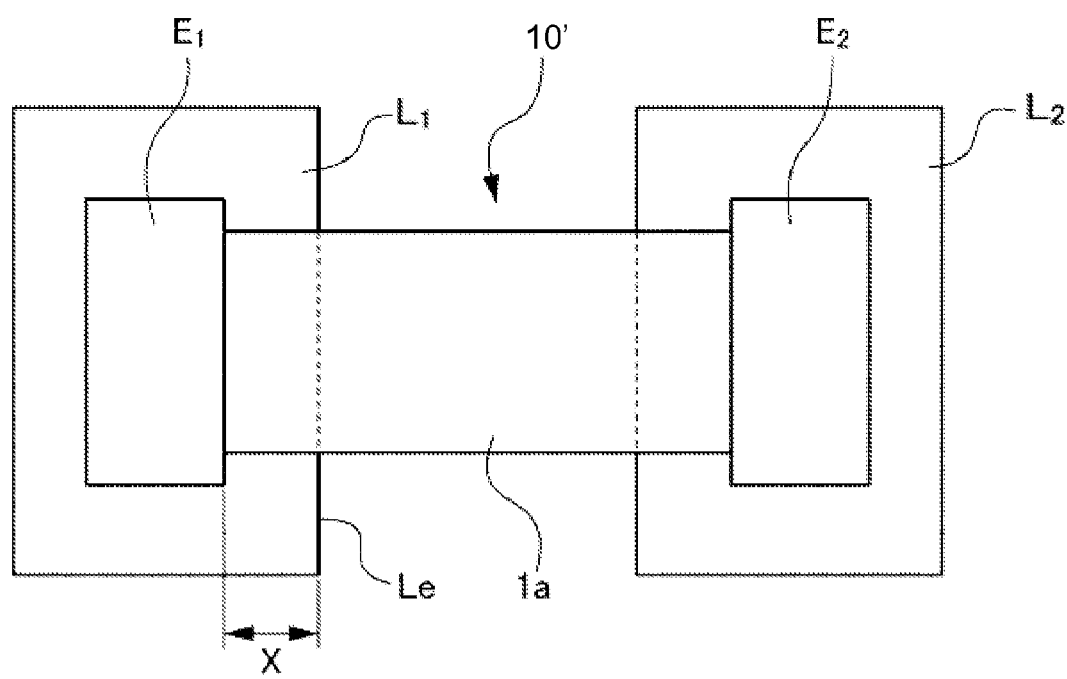
FIG. 13 is a schematic plan view provided for an optimization study of a mounting structure of a chip component.
Figure 14A:
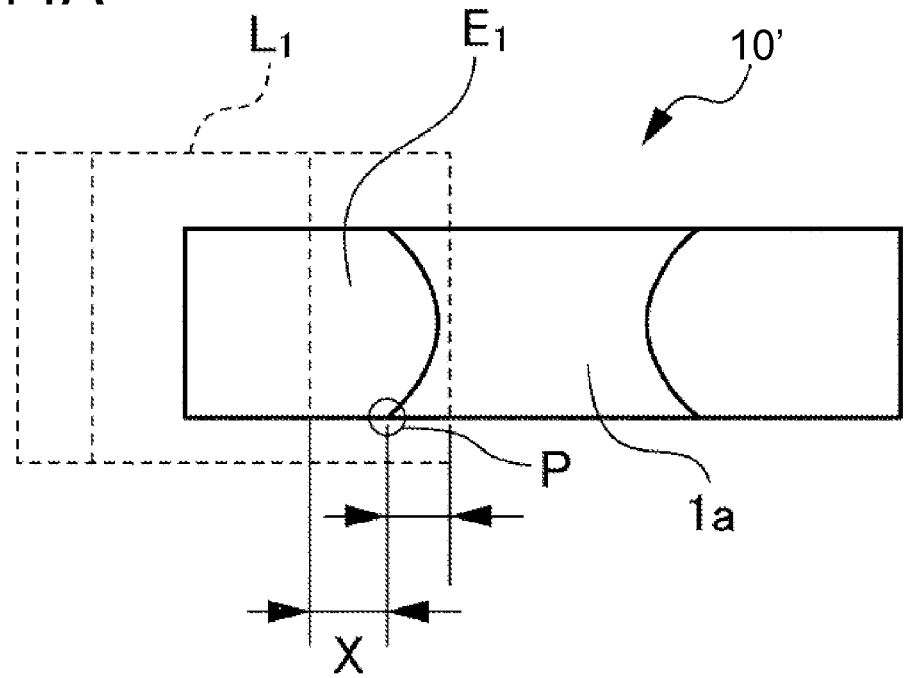
FIG. 14A is a schematic view for describing the starting point of a crack in the mounting structure shown in FIG. 13.
Figure 14B:
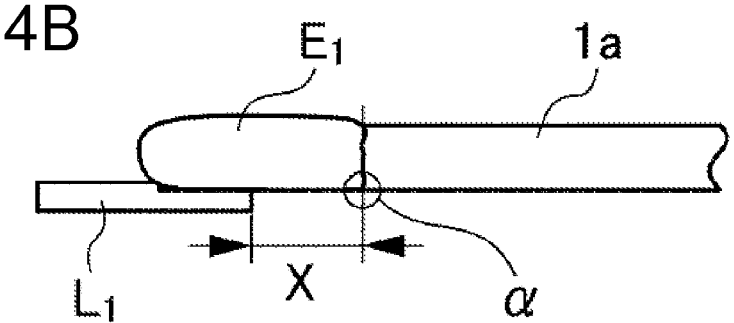
FIG. 14B is a side view of a case in which the boundaries between the external terminal electrodes and the element body of the chip component are outside of the lands of the substrate wiring lines.
Figure 14C:
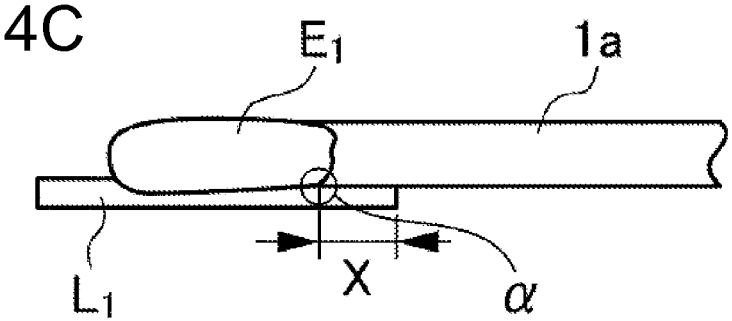
FIG. 14C is a side view of a case in which the boundaries between the external terminal electrodes and the element body of the chip component are within the lands of the substrate wiring lines.
Figure 15A:
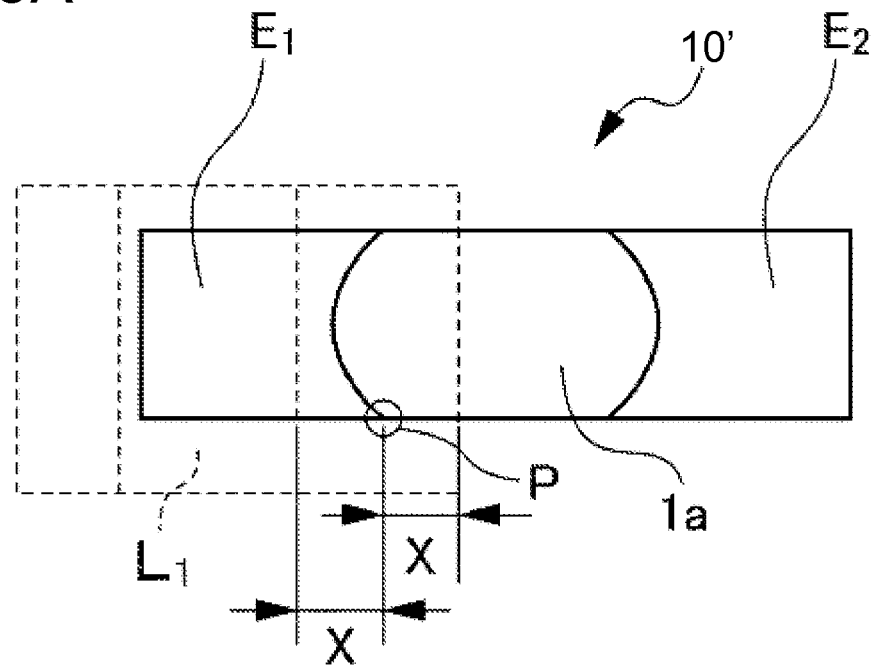
FIG. 15A is a schematic view for describing the starting point of a crack in the mounting structure shown in FIG. 13.
Figure 15B:
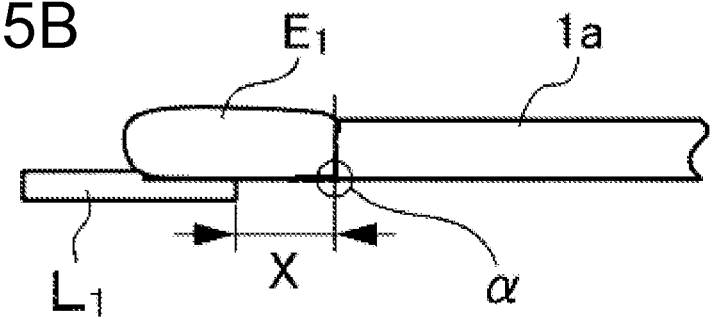
FIG. 15B is a side view of a case in which the boundaries between the external terminal electrodes and the element body of the chip component are outside of the lands of the substrate wiring lines.
Figure 15C:
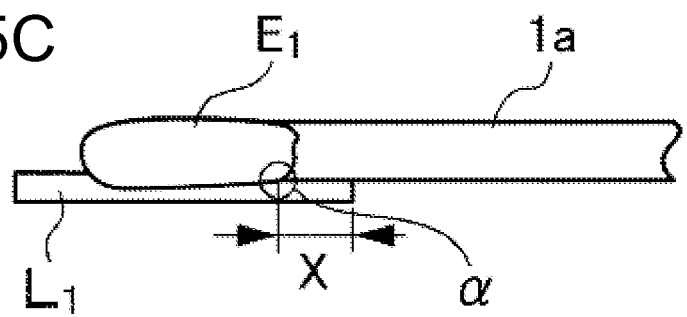
FIG. 15C is a side view of a case in which the boundaries between the external terminal electrodes and the element body of the chip component are within the lands of the substrate wiring lines.

As shown in FIG. 10, the edges Ef and Ef can have curved shapes with middle portions thereof that are recessed from the respective land edges 20Le on the attaching substrate 1. In this case also, the crack starting points a are the intersection points between the ridge lines of the element body 10a of the chip component 10 and the edges Ef and Ef. In other words, in a similar manner, whether the external terminal electrodes $10E_1$ and $10E_2$ are within the lands $20L_1$ and $20L_2$ (refer to FIG. 11), or whether the external terminal electrodes $10E_1$ and $10E_2$ protrude outside of the lands $20L_1$ and $20L_2$ (refer to FIG. 12), the starting points α of the cracks are at the intersection points between the ridge lines of the element body 10a of the chip component 10 and the edges Ef and Ef. Where the intersection points between the vertical lines from the crack starting points a towards the attaching substrate 1 and the attaching substrate 1 are starting points P, the respective distances of the perpendicular lines from the respective starting points P and towards the land edges 20Le are "d."

The mounting structure of a chip component according to the present invention has been described above with various embodiments. In any case, in the present invention, where intersection points between vertical lines from edges of the external terminal electrodes at ridge lines formed between horizontal surfaces and side faces of the chip component, and land surfaces or an imaginary land surface are starting points; where the intersection points between the perpendicular lines from the starting points towards the land edges on the sides opposite to the conductor wiring line drawing side, and the land edges are the ending points; where the distances between the starting points and the ending points are "d;" and where the distances between the edges on the bottom of the external terminal electrodes and the starting points are "t," d>t/tan 35° is satisfied. Thus, it is possible to attain exceptional effects such as the fact that it is possible for the chip component to exhibit resistance to cracking resulting from stress from the outside after mounting, that it is possible to attain a desired post-mounting strength, and that it is possible to attain an optimized mounting structure based on the dimensions of the chip component to be used, which could not be attained with conventional mounting structures.

It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A mounting structure of a chip component, comprising a chip component having an element body and a pair of external terminal electrodes provided on both ends of the element body, the external terminal electrodes being bonded respectively to a pair of lands through solder, the pair of lands being disposed on an attaching substrate in a lateral direction with respect to each other, wherein the chip component has a smaller thickness compared to a length and a width of the element body of the chip component, and wherein, where a plan view distance from an end of each of the external terminal electrodes at a ridge line formed by a front surface and a side face of the element body of the chip component to an edge of a corresponding land connected to each of the external terminal electrodes is "d," and where a vertical distance between a bottom surface of each of the external terminal electrodes and each of the lands is "t," d>t/tan 35° is satisfied.

2. A mounting structure of a chip component, comprising a chip component having an element body and a pair of external terminal electrodes provided on both ends of the element body, the external terminal electrodes being bonded respectively to a pair of lands through solder, the pair of lands being disposed on an attaching substrate in a lateral direction with respect to each other, wherein the chip component has a smaller thickness compared to a length and a width of the element body of the chip component, and wherein, where an intersection point between a vertical line from an edge of each of the external terminal electrodes at a ridge line formed between a front surface and a side face of the element body of the chip component, and a land surface or an imaginary land surface is a starting point, where an intersection point between a perpendicular line extending from the starting point to the edge of a corresponding land and the edge of the land is an ending point, where a distance from the starting point to the ending point is "d," and where a vertical distance from the edge of each of the external terminal electrodes at a bottom surface thereof to the starting point is "t," d>t/tan 35° is satisfied.

3. The mounting structure of a chip component according to claim 2, wherein the edges of the external terminal electrodes are positioned further within the lands than the land edges on the attaching substrate.

4. The mounting structure of a chip component according to claim 2, wherein the edges of the external terminal electrodes are positioned further outside of the lands than the land edges on the attaching substrate.

5. The mounting structure of a chip component according to claim 2, wherein the edges of the external terminal electrodes form straight lines.

6. The mounting structure of a chip component according to claim 2, wherein the edges of the external terminal electrodes have curved shapes with middle portions thereof that respectively protrude towards the pair of land edges facing each other on the attaching substrate.

7. The mounting structure of a chip component according to claim 2, wherein the edges of the external terminal electrodes have curved shapes with middle portions thereof that are respectively recessed from the land edges on the attaching substrate.

8. The mounting structure of a chip component according to claim 1, wherein d>t/tan 25° is satisfied.

9. The mounting structure of a chip component according to claim 2, wherein d>t/tan 25° is satisfied.

* * * * *